United States Patent
Keramat et al.

(10) Patent No.: US 8,537,040 B2
(45) Date of Patent: Sep. 17, 2013

(54) DATA CONVERTER CURRENT SOURCES USING THIN-OXIDE CORE DEVICES

(75) Inventors: Mansour Keramat, Santa Clara, CA (US); Yuan-Ju Chao, Santa Clara, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 13/297,240

(22) Filed: Nov. 15, 2011

(65) Prior Publication Data

US 2013/0120177 A1   May 16, 2013

(51) Int. Cl.
*H03M 1/66* (2006.01)
(52) U.S. Cl.
USPC ............................. 341/136; 341/135; 341/144
(58) Field of Classification Search
USPC .......................... 341/135, 136, 144; 323/315
See application file for complete search history.

(56) References Cited

U.S. PATENT DOCUMENTS

| | | | | |
|---|---|---|---|---|
| 5,444,363 A * | 8/1995 | Cabler | ........................... | 323/315 |
| 5,489,902 A * | 2/1996 | Shyu et al. | ..................... | 341/136 |
| 5,598,095 A * | 1/1997 | Schnaitter | ..................... | 323/315 |
| 5,706,006 A * | 1/1998 | Hattori | ........................... | 341/144 |
| 6,509,855 B1 * | 1/2003 | Cable | ........................... | 341/144 |
| 7,583,941 B2 * | 9/2009 | Nariman | ..................... | 455/127.2 |
| 2002/0186156 A1 * | 12/2002 | Inagaki et al. | ................. | 341/144 |
| 2008/0186101 A1 * | 8/2008 | Arakali et al. | ................. | 330/296 |
| 2009/0174587 A1 * | 7/2009 | Ogawa et al. | ................. | 341/144 |
| 2010/0156388 A1 * | 6/2010 | Yang et al. | ..................... | 323/315 |

* cited by examiner

*Primary Examiner* — Howard Williams
(74) *Attorney, Agent, or Firm* — Heimlich Law, PC; Alan Heimlich, Esq.

(57) ABSTRACT

Systems and methods are disclosed for performing data conversion by matching current sources using a thin oxide device; and minimizing voltage stress on the thin oxide device during operation or power down.

21 Claims, 4 Drawing Sheets

DATA CONVERTER CURRENT SOURCES USING THIN-OXIDE CORE DEVICES

BACKGROUND

Current steering digital-to-analog converter (DAC) is widely used in modern analog and mixed-signal circuit system especially for high sampling rate applications. It consists of an array of current sources, the number of array depends on DAC's decoding scheme either thermometer, binary or segmented. The DAC linearity is mainly determined by the matching of the current sources.

When designing a high speed DAC many tradeoffs have to be taken into account. These include the type of the DAC (current steering or a voltage output DAC), the number of bits and required speed. For high speed DACs usually a current steering converter is selected because of the speed advantages of this converter type with respect to the voltage output DAC. In most current steering DAC designs a combination of binary and thermometer code weighting is used. The thermometer code is used for the Most Significant Bits (MSBs), while binary code for the Least Significant Bits (LSBs) is used. This is called segmentation: 0% segmentation means a fully binary converter and 100% segmentation means a full thermometer code converter. The DAC designer has to choose the optimum amount of segmentation taking into account the physical problems associated with the segmentation. Current steering DACs with a low amount of segmentation have the advantage that they are simple. They only need a few current sources and switches. The disadvantage of low segmentation is the possible larger DNL compared to the converter converters with larger segmentation. Converters with larger segmentation result in a lower DNL, but the problems associated with the output conductance, capacitance and charge feed-through increase and also the area and power that is needed increases. In addition, due to the larger area required and the larger difference in output impedance between the lowest output code and the highest output code, the timing errors become more dominant.

The basic principle of current steering DACs is the summation of currents according to the input. In a binary current steering converter, the current sources are connected parallel to each other. These current sources are connected to switches; the switches connect the current source to the output node. The switches are controlled by the input code of the DAC. The output current of the DAC is therefore proportional to the input code word. The output node of the DAC is connected to a resistor. This resistor converts the output current of the DAC into a voltage.

FIG. 1 shows a conventional PFET current source and NFET current source. In the PFET current source, a thick oxide transistor or device 10 is connected to the voltage rail. A positive thick oxide device 12 switches the output of thick oxide device 10 (which is connected to VDD supply rail) to generate a positive current output and a negative thick oxide device 14 switches the output of the thick oxide device 10 to generate a negative current output. Similarly, for an NFET current source, a positive thick oxide device 22 switches the output of thick oxide device 20 to generate a positive current output and a negative thick oxide device 14 switches the output of thick oxide 20 (which is connected to ground) to generate a negative current output.

The technology process from chip manufacturers usually provides two kinds of transistor devices: thick-oxide and thin-oxide devices. Faster thin-oxide devices sometimes are called core devices and they are used mainly for logic circuitry. Thick-oxide device can operate at higher supply voltage and they are used in IO, interface and analog circuitry. For advanced process such as 65 nm or below, the operation supply voltage for core device is around 1.0 Volt and the supply voltage for thick-oxide device is either 2.5V or 3.3V. Operating thin-oxide devices on higher supply results in voltage stress, device breakdown and causes device reliability issue. The mismatch of devices is mainly due to the threshold voltage of devices. Since the thin-oxide has smaller threshold voltage, its matching characteristic is superior to thick-oxide devices. For IO supply powered DAC such as 3.3V, conventionally thick-oxide devices are required in the current source to prevent the voltage stress on the devices.

SUMMARY

In one aspect, systems and methods are disclosed for performing data conversion by matching current sources using a thin oxide device; and minimizing voltage stress on the thin oxide device during operation or power down.

In another aspect, a current source for a data converter includes a thin oxide device coupled to a current source to receive power; a thick oxide device coupled to the current source thin oxide device, wherein the thick oxide device and the current source thin oxide device form a cascoded device for increased current source output impedance; and one or more thick oxide switches coupled to the thick oxide device.

In a third aspect, a data converter includes a plurality of thin oxide devices coupled to a current source to receive power, wherein the thin oxide devices matches current sources; a plurality of thick oxide devices coupled to the thin oxide devices to minimize voltage stress on the thin oxide devices during operation or power down; and a controller coupled to the thick oxide devices to generate a voltage output for the data converter.

Implementations of the above aspects can include one or more of the following. The current source thin oxide device matches current sources. The current source thin oxide device is a thin oxide transistor. The thin oxide transistor minimizes mismatch voltage $$\Delta V_{TH} = \frac{A_{vt}}{\sqrt{W \times L}}$$

where Avt parameter is provided by a foundry and Area is a transistor width multiplied by a transistor length. A circuit is provided for turning off the thin oxide device during power down. The circuit also limits a power voltage to below the thin oxide device supply voltage. The circuit can also bias the thin oxide device supply voltage. The biasing circuit includes a second thin oxide transistor in the biasing circuit. The circuit turns off the thin oxide device and the second thin oxide device during power down. The switches can include a first thick oxide switch connected to the thick oxide device to generate a positive current output and a second thick oxide switch connected to the thick oxide device to generate a negative current output.

The preferred embodiments achieves better current source matching than conventional current sources. This is achieved with a very small silicon area without suffering device stress and breakdown. The current source using thin-oxide device architecture achieves better current cell matching which results in better DAC linearity. With proper bias design, the thin-oxide current source DAC achieves a much smaller silicon area without suffering any device voltage stress, device voltage breakdown or other reliability issue.

BRIEF DESCRIPTION OF THE DRAWINGS

An appreciation of the features and benefits of the present invention and a more complete understanding of its structure may be had by studying the following description of the preferred embodiment and by referring to the accompanying drawings.

DESCRIPTION

The term "NFET" refers to an N-type metal oxide semiconductor field effect transistor. Likewise, when used herein, "PFET" refers to a P-type metal oxide semiconductor field effect transistor. It should be appreciated that whenever the terms, "NFET", "PFET", and "transistor," are used, unless otherwise expressly indicated or dictated by the nature of their use, they are being used in an exemplary manner. They encompass the different varieties of MOS devices including devices that don't literally use "metal", i.e., using another suitable material in place of metal such as polysilicon, and devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of multi-gated transistors, known today or not yet developed.

Figure 1:
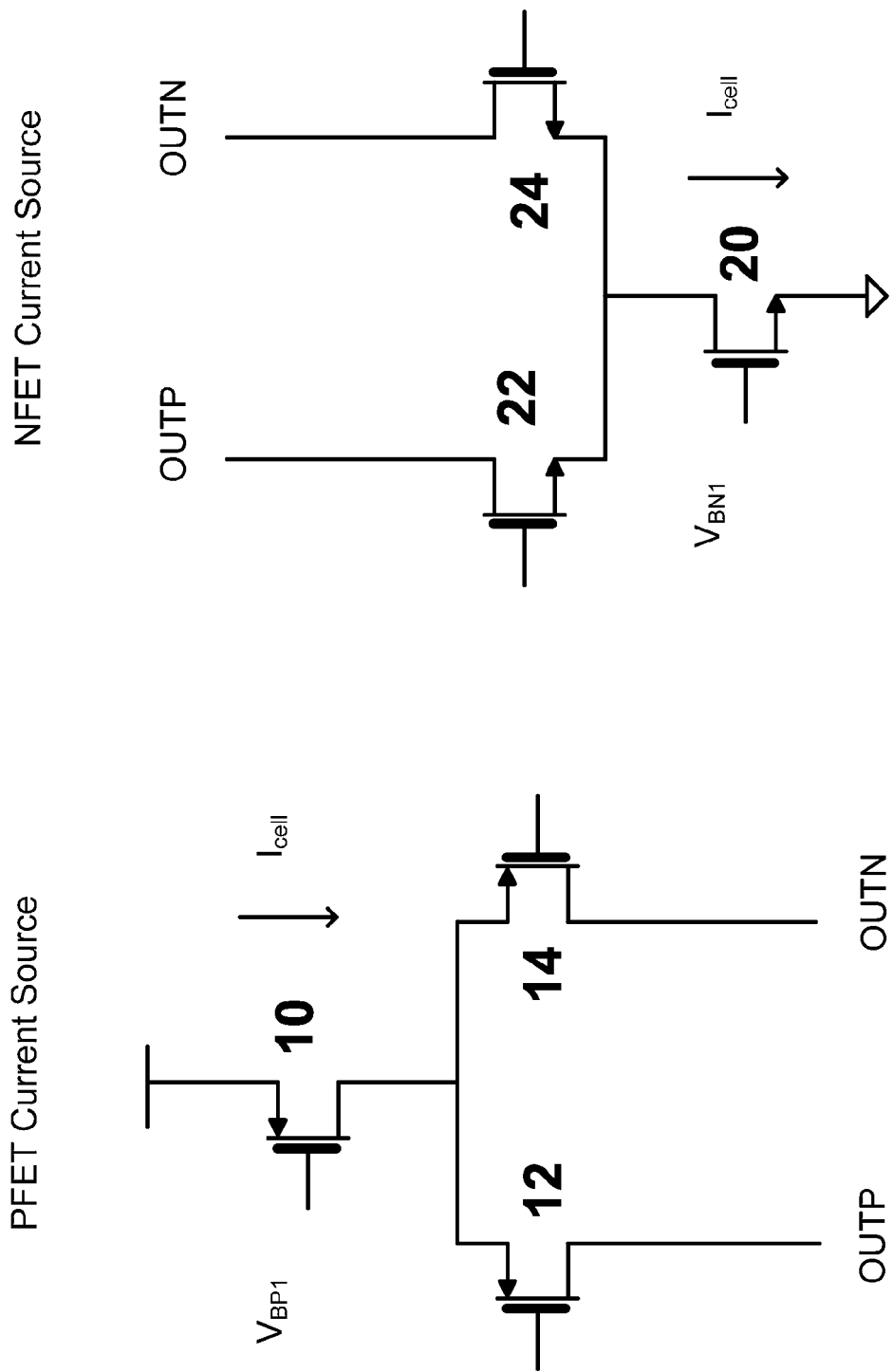
FIG. 1 shows conventional current sources.
Figure 2:
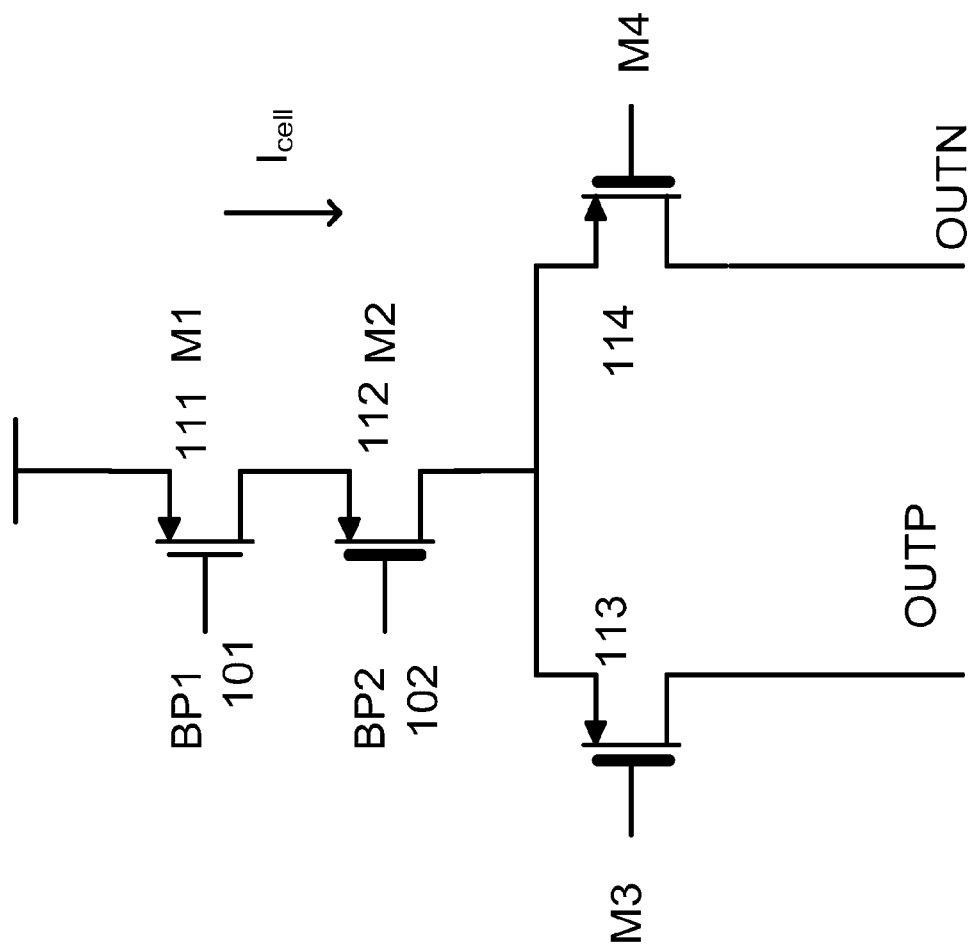
FIG. 2 shows an exemplary current source with a thin oxide device.

FIG. 2 shows an exemplary current source with a thin oxide device. The current source for a data converter includes a thin oxide device M1 111 coupled to a current source to receive power and controlled by bias voltage BP1 101. A thick oxide device M2 112 is connected to the current source thin oxide device M1 111 and controlled by bias voltage BP2 102. The thick oxide device 112 and the current source thin oxide device 111 form a cascoded device for increased current source output impedance. The system also includes first and second thick oxide switches M3 and M4 113-114 connected to the thick oxide device to provide positive and negative current outputs, respectively. The matching of current sources is determined by M1. M2 protects M1 from voltage stress and also acts as a cascoded device to increase the current source output impedance. M3 and M4 are switches to determine the current goes to either OUTP or OUTN. Thus, the current sources use a thin oxide transistor as the current source, a thick oxide transistor as the cascoded device and two oxide devices for switches.

The current source thin oxide device 111 improves matched current sources as it is a thin oxide transistor. The matching between the current sources is the main factor of DAC's linearity characteristic. And the linearity characteristic directly affects DAC's static performance Integral Nonlinearity (INL), Differential Nonlinearity (DNL) and dynamic performance Spurious Free Dynamic Range (SFDR) etc. The main mismatch between current sources is due to threshold voltage (Vt) mismatch. The use of thin oxide transistor minimizes mismatch voltage $$\Delta V_{TH} = \frac{A_{vt}}{\sqrt{W \times L}} \text{ or alternatively}$$

$$Vmismatch = \frac{A_{vt}}{\sqrt{Area}}$$

where Avt parameter is provided by a foundry and Area is a transistor width W multiplied by a transistor length L.

Due to the fact that thin-oxide core devices have smaller threshold voltage (Vt) and result in better matching than thick-oxide devices, it is advantageous to use thin oxide in the current sources if the voltage stress issue can be prevented. The benefit is a much smaller silicon area for a given matching requirement.

Although the system of FIG. 2 is a PFET thin oxide current source, it is contemplated that thin oxide NFET current sink and associated switches can be used.

Figure 3:
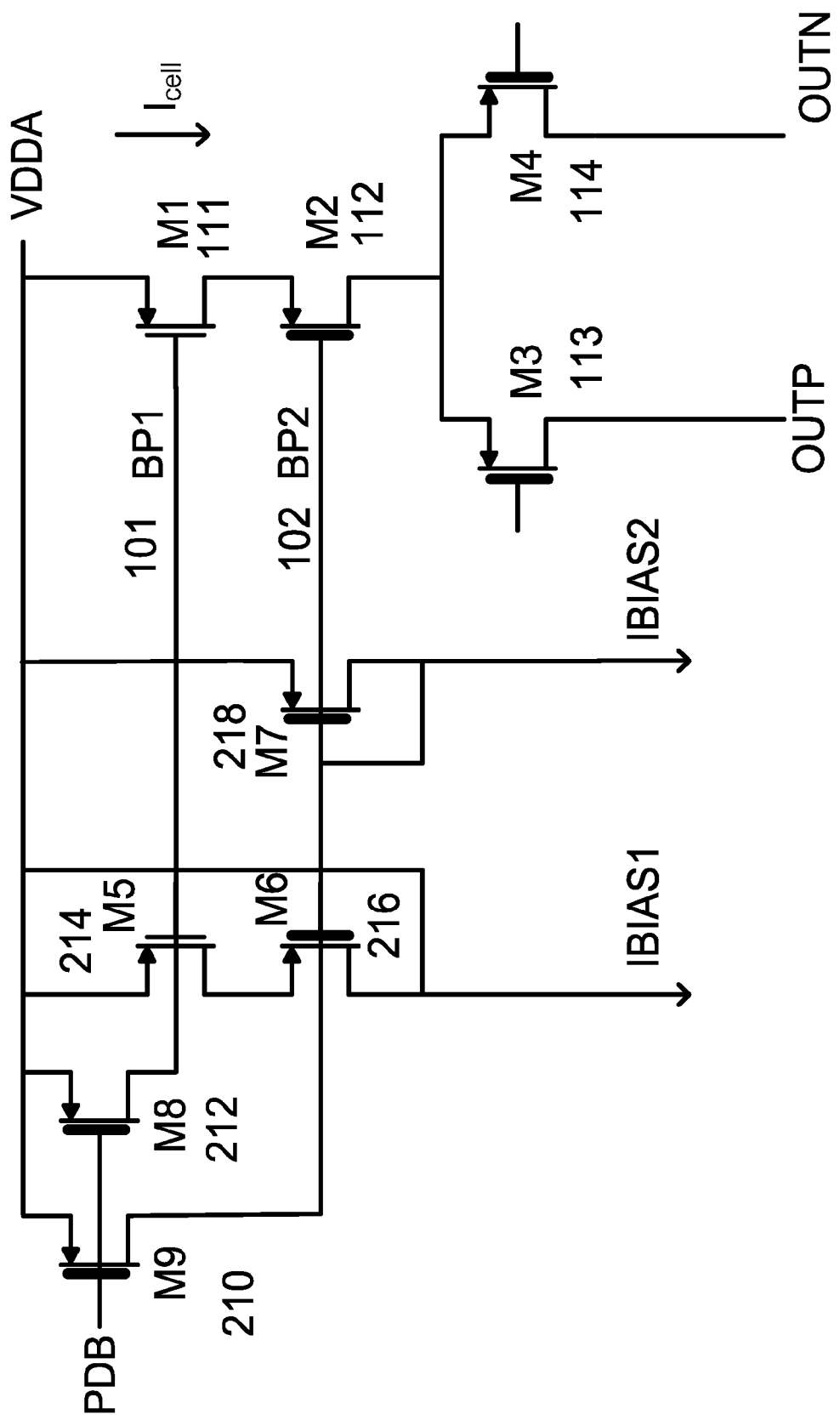
FIG. 3 shows a biasing circuit with the current source of FIG. 2.

FIG. 3 shows a biasing circuit with the current source of FIG. 2. The circuit allows for turning off the thin oxide device during power down. A circuit is provided for limiting a power voltage to below the thin oxide device supply voltage.

Turning now to FIG. 3, a circuit is provided for biasing a thin oxide device supply voltage. The biasing circuit includes a second thin oxide transistor in the biasing circuit. The circuits includes thick oxide transistors M9 210 connected to thick oxide transistor M8 212 and M6 216 which generates the IBIA S1 and S2 signals, respectively. Transistor M8 212 in turn generates signal BP1 101. The circuit turns off the thin oxide device and the second thin oxide device during power down. The switches can include a first thick oxide switch connected to the thick oxide device to generate a positive current output and a second thick oxide switch connected to the thick oxide device to generate a negative current output.

During the normal operation, M3 and M4 switches are driven by decoder and one of them is turned on and the other is turned off. Assuming switch M3 is on while M4 is off, the drain voltage of M1 $V_D$ ($M_1$) is set by BP2 voltage with the following equation while M2 is in the saturation region:

$$I_{cell} = \frac{1}{2} u_n C_{ox} \frac{W}{L} [V_D, (M_1) - BP2 - V_{TH}, (M_2)]^2$$

It is critical to make sure that voltage of VDDA-$V_D$($M_1$) does not exceed manufacture's suggested value, usually around 20% over the core supply. By using thick oxide devices on M2, M3 and M4 and similarly M6, M7, thin-oxide devices M1 and M5 can be prevented from voltage stress.

During the power down, both BP1 and BP2 are pulled to VDDA by device M8 and M9 so that thin oxide devices M1 and M5 are turned off and they are not stressed on voltage neither.

With a predetermined bias voltage BP1 and BP2, the current source structure thin oxide device M1 is not voltage stressed to exceed the foundry suggested voltage either in normal operation or power down mode.

Figure 4:
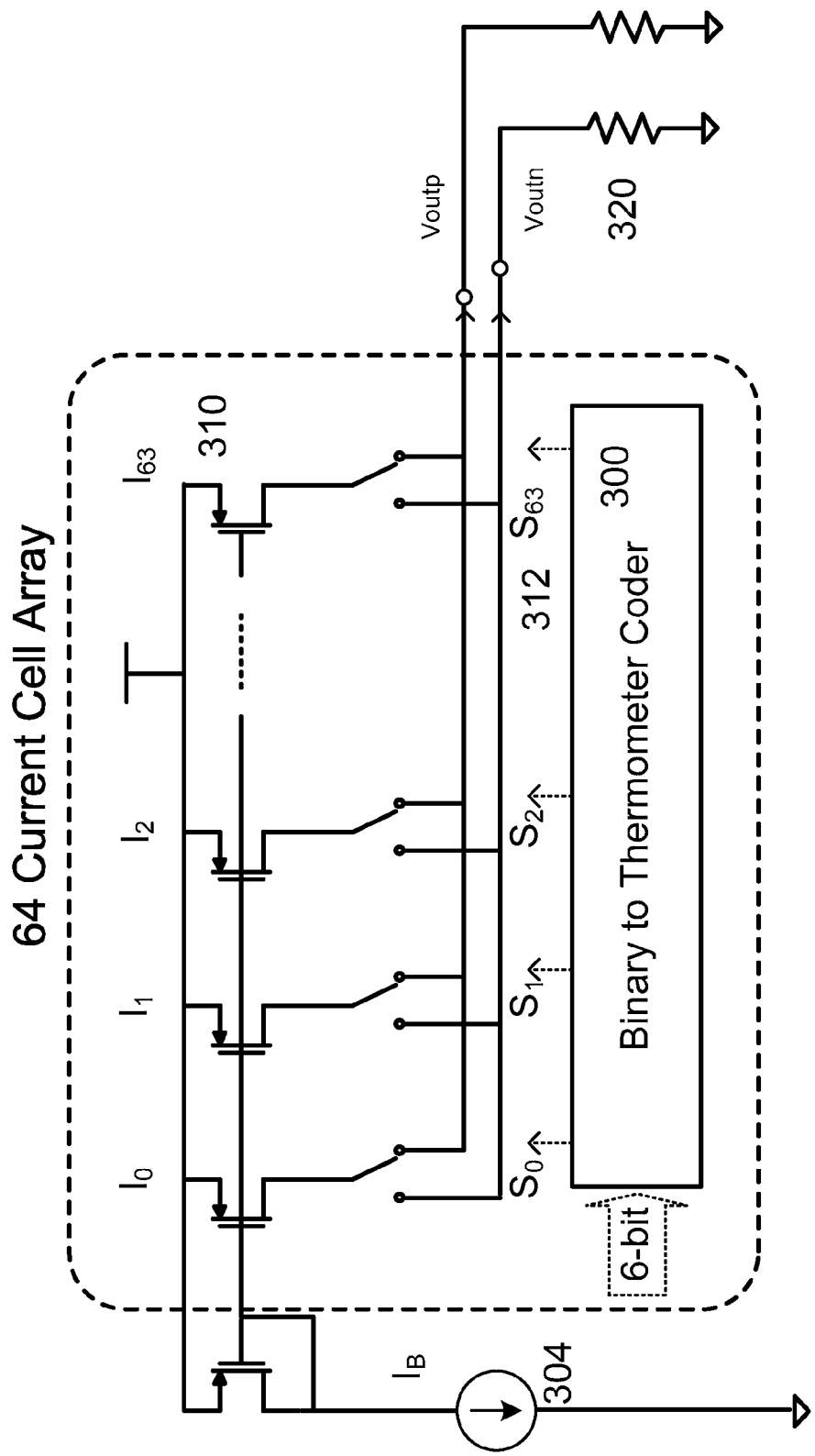
FIG. 4 shows an exemplary data converter using the current sources of FIG. 2

FIG. 4 shows an exemplary data converter using the current sources 310 as detailed in FIG. 2. The current sources 310 are connected to a current generator 304. A controller 300 controls the switches to generate the desired output voltage. The data converter is a current steering digital to analog converter (DAC) which consists of an array of current sources shown in FIG. 4. The currents are summed at the output and delivered to the output resistor load 320, which is predetermined for a 6-bit DAC in this example. The number of current sources depends on the architecture of thermometer, binary or segmented decoding schemes. Take an N-bit DAC as an example, thermometer DACs have 2^N equal current amount current sources. In this example, the controller 300 is a binary to thermometer coder for 6-bits of resolution. Other DAC architecture can be used. For example, binary DACs have N current sources with binary weighted current amount and segmented DACs have the number of current source between 2^N to N depending on the ratio of thermometer and binary current sources. For the applications that DAC's output voltage swing is greater than the core voltage, the supply voltage is higher than the core voltage and the thick oxide devices are used in the current source to prevent device voltage stress or breakdown.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A current source for a data converter, comprising
a thin oxide device coupled to a current source to receive power;
a thick oxide device coupled to the current source thin oxide device, wherein the thick oxide device and the current source thin oxide device form a cascoded device for increased current source output impedance; and
one or more thick oxide switches coupled to the thick oxide device.

2. The current source of claim 1, wherein the current source thin oxide device matches current sources.

3. The current source of claim 1, wherein the current source thin oxide device comprises a thin oxide transistor.

4. The current source of claim 3, wherein the thin oxide transistor minimizes mismatch voltage $$Vmismatch = \frac{A_{vt}}{\sqrt{Area}}$$

where Avt parameter is provided by a foundry and Area is a transistor width multiplied by a transistor length.

5. The current source of claim 1, wherein the thick oxide device and thick oxide switches comprise thick oxide transistors.

6. The current source of claim 1, comprising means for turning off the thin oxide device during power down.

7. The current source of claim 1, comprising means for limiting a power voltage to below the thin oxide device supply voltage.

8. The current source of claim 1, comprising means for biasing a thin oxide device supply voltage.

9. The current source of claim 8, comprising a second thin oxide device in the biasing means, further comprising means for turn off the thin oxide device and the second thin oxide device during power down.

10. The current source of claim 1, comprising a first thick oxide switch coupled to the thick oxide device to generate a positive current output and a second thick oxide switch coupled to the thick oxide device to generate a negative current output.

11. A data conversion method, comprising
matching current sources using thin oxide devices; and
minimizing voltage stress on the thin oxide device during operation or power down by lowering a voltage seen by the thin oxide device.

12. The method of claim 11, comprising minimizing a mismatch voltage defined by a foundry parameter and transistor area.

13. The method of claim 11, comprising turning off the thin oxide device during power down.

14. The method of claim 11, comprising limiting a power voltage to below the thin oxide device supply voltage.

15. The method of claim 11, comprising biasing the thin oxide device supply voltage.

16. The method of claim 15, comprising using a second thin oxide device in the biasing of the thin oxide device, further comprising turning off the thin oxide device and the second thin oxide device during power down.

17. The method of claim 11, comprising selecting a positive current output with a first thick oxide switch and selecting a negative current output with a second thick oxide switch.

18. The method of claim 11, comprising forming a cascoded device with a thick oxide device coupled to the thin oxide for increased current source output impedance.

19. A data converter, comprising:
a plurality of thin oxide devices each coupled to a current source to receive power, wherein the thin oxide devices matches a plurality of current sources;

a plurality of thick oxide devices coupled to the thin oxide devices to minimize voltage stress on the thin oxide devices during operation or power down; and a controller coupled to the thick oxide devices to generate a voltage output for the data converter.

20. The data converter of claim 19, wherein each thin oxide device is coupled to a first thick oxide device, comprising:

a second thick oxide switch coupled to the first thick oxide device to generate a positive current output;

a third thick oxide switch coupled to the first thick oxide device to a negative current switch, and; and a biasing circuit coupled to a thin oxide device supply voltage, wherein the biasing circuit comprises thick and thin oxide devices.

21. The data converter of claim 19, wherein the current sources form a current steering digital to analog converter.

* * * * *